(12) United States Patent
Yang et al.

(10) Patent No.: US 7,663,434 B2
(45) Date of Patent: Feb. 16, 2010

(54) DOHERTY AMPLIFIER

(75) Inventors: Youngoo Yang, Suwon-si (KR);
Hyun-Chul Park, Jinju-si (KR);
Sung-Chan Jung, Suwon-si (KR)

(73) Assignee: Sungkyunkwan University,
Cheoncheon-Dong, Jangan-Gu,
Suwon-Si, Gyeonggi-Do (KR)

( * ) Notice: Subject to any disclaimer, the term of this patent is extended or adjusted under 35 U.S.C. 154(b) by 50 days.

(21) Appl. No.: 12/022,861

(22) Filed: Jan. 30, 2008

(65) Prior Publication Data
US 2009/0102553 A1    Apr. 23, 2009

(30) Foreign Application Priority Data
Sep. 3, 2007    (KR) ...................... 10-2007-0088868

(51) Int. Cl.
*H03F 3/68* (2006.01)
(52) U.S. Cl. .................................. 330/124 R; 330/295
(58) Field of Classification Search ............. 330/124 R, 330/295
See application file for complete search history.

(56) References Cited

U.S. PATENT DOCUMENTS

2007/0139106 A1    6/2007 Dittmer et al.
2007/0229165 A1*   10/2007 Elmala et al. ............... 330/286

FOREIGN PATENT DOCUMENTS

| JP | 2002204133 | 7/2002 |
| JP | 05029851 | 2/2005 |
| KR | 1020050029998 | 3/2005 |

* cited by examiner

*Primary Examiner*—Steven J Mottola

(57) ABSTRACT

The present invention relates to the construction of output stage of the Doherty amplifier and comprises a main amplifying unit, an auxiliary amplifying unit and a compact λ/4 line connecting two amplifying units. The compact λ/4 line connecting two amplifying units includes a first parallel capacitor grounded by being connected to the main amplifying unit in parallel; a second parallel capacitor grounded by being connected to the auxiliary amplifying unit in parallel; and an inductor or a microstrip transmission line connecting the main amplifying unit and the auxiliary amplifying unit. The Doherty amplifier in accordance with the present invention further comprises a matching network unit connecting to a final output by connecting the main amplifying unit and the auxiliary amplifying unit and; and a λ/4 line used as the voltage inputs of the main amplifying unit and the auxiliary amplifying unit.

7 Claims, 5 Drawing Sheets

[FIG 1]
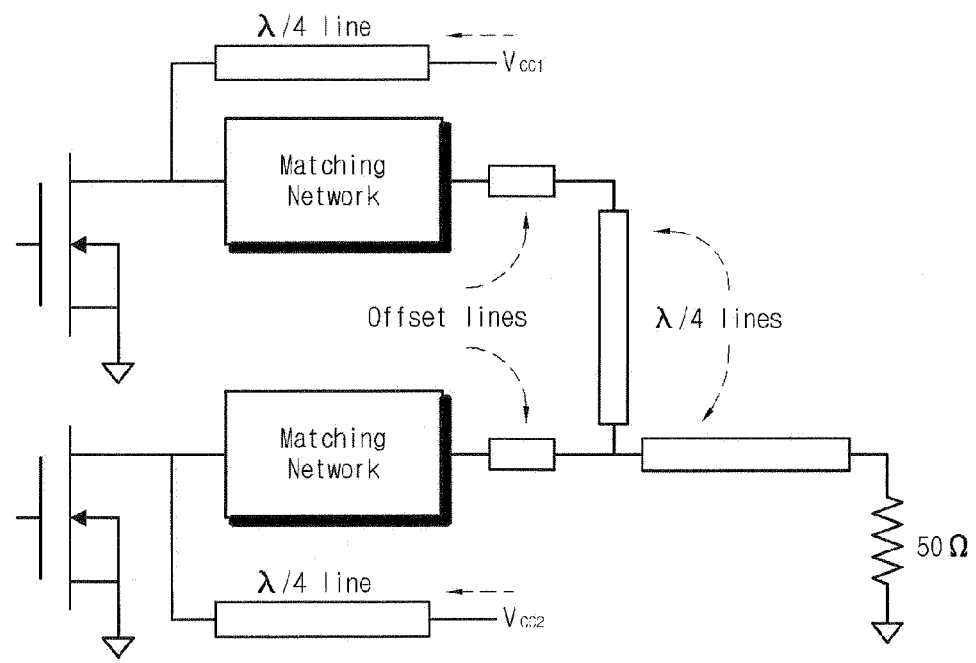
PRIOR ART

[FIG 2]
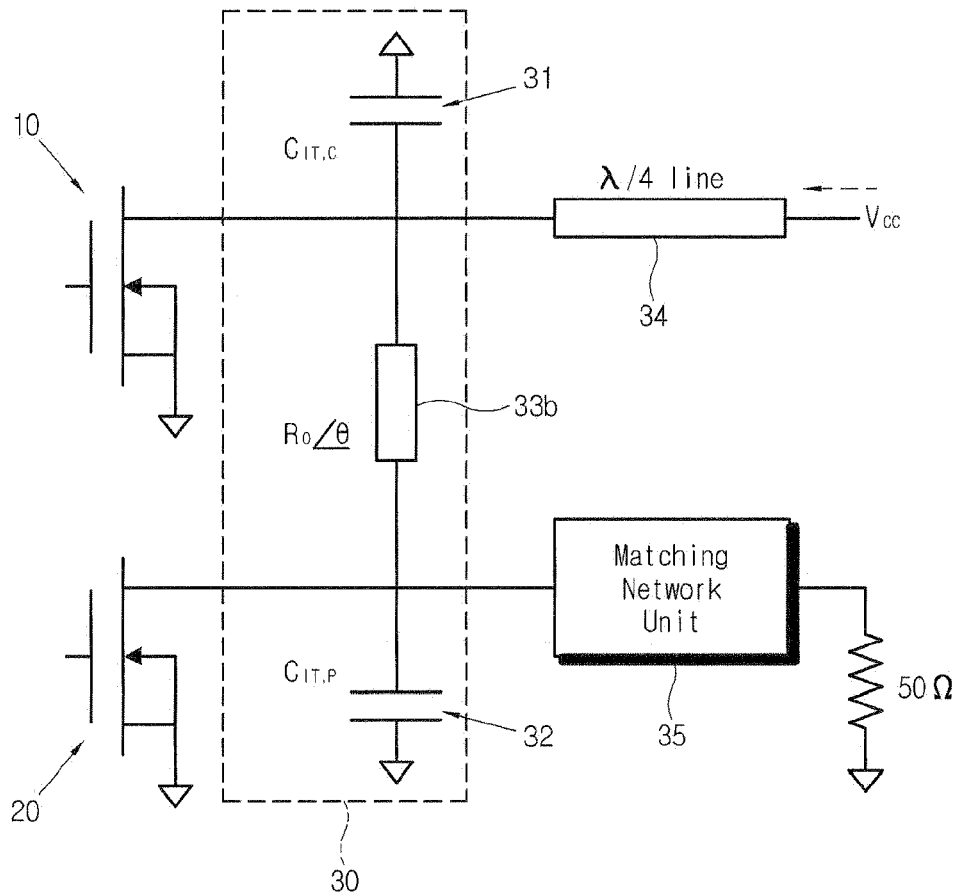
[FIG 3]
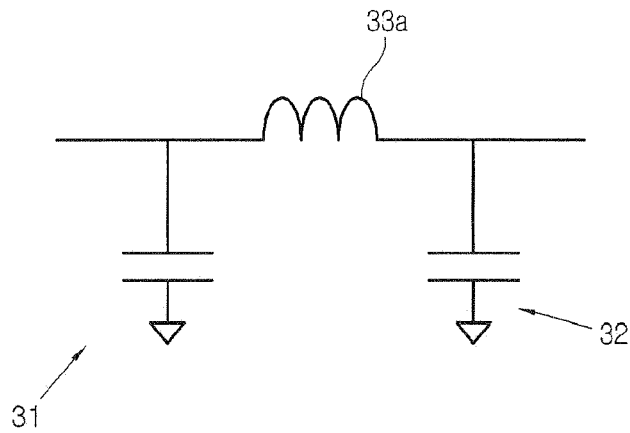

[FIG 4]
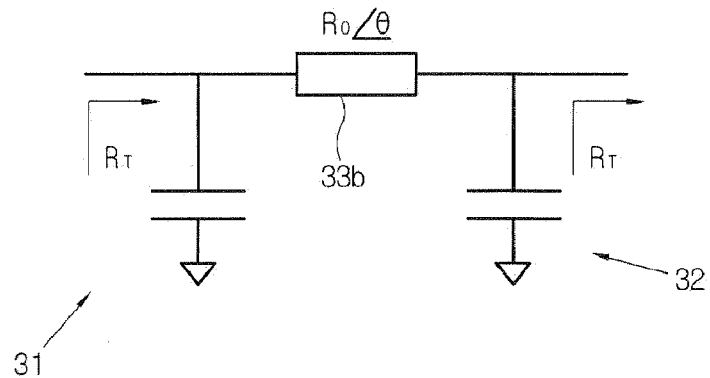
[FIG 5]
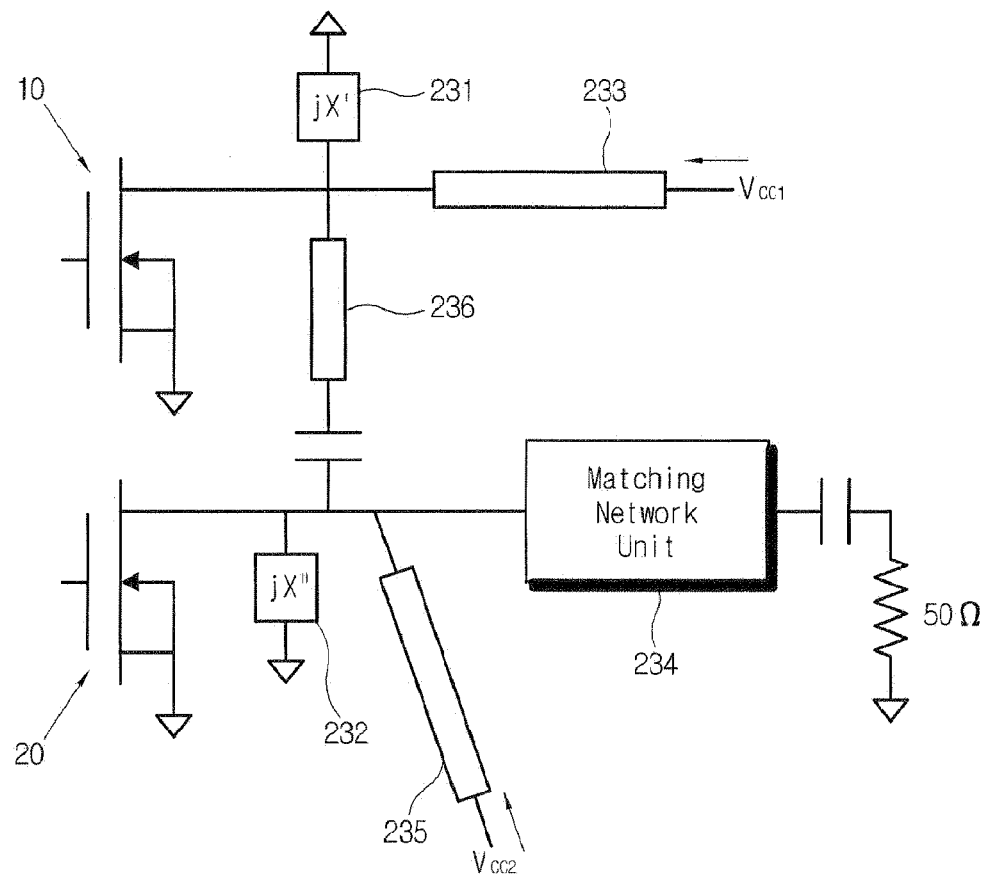

[FIG 6]
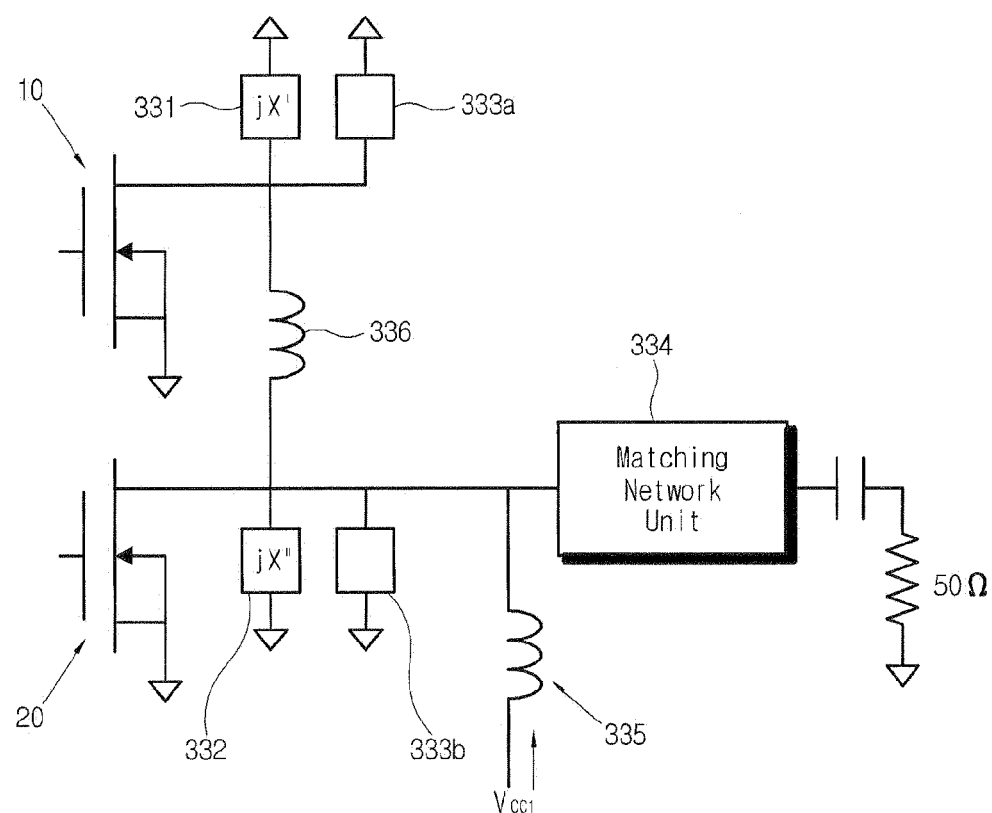

[FIG 7]
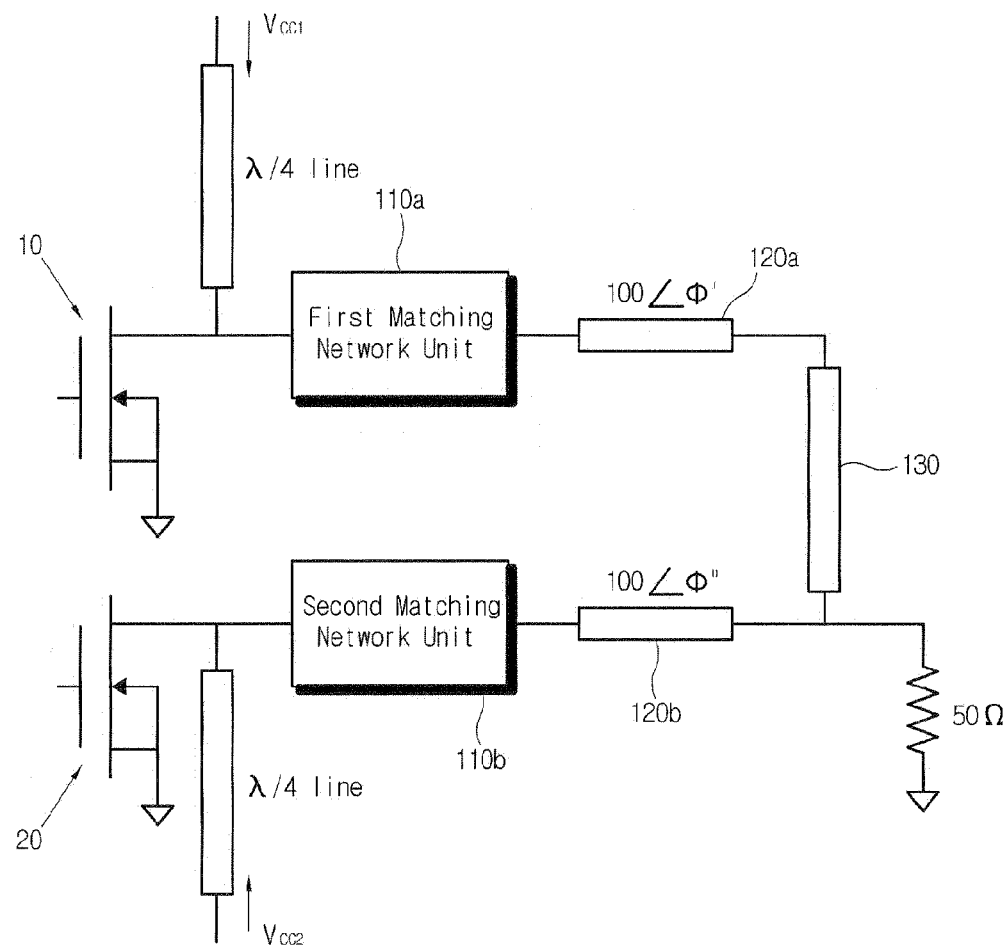

DOHERTY AMPLIFIER

BACKGROUND OF THE INVENTION

1. Field of the Invention

The present invention relates to a Doherty amplifier; and; more particularly, to a Doherty amplifier capable of maintaining linearity and high efficiency with reducing the size of a circuit and simplifying the structure thereof.

2. Background of the Related Art

Generally, a modulation signal having a high peak to average power ratio (PAPR) is used for transmitting a great deal of information, and this causes a power amplifier to considerably consume the current and reduces efficiency thereof remarkably. A Doherty method is used as one of methods to solve such problems, and it is widely applied to a power amplifier for a base station, a repeater, a portable terminal or the like by improving the efficiency in a wide output power range.

Such a Doherty amplifier is composed of an output stage unlike that of a conventional amplifier, and FIG. 1 is a diagram showing the exemplary general output stage of a conventional Doherty amplifier. Referring to the FIG. 1, the Doherty amplifier has a main amplifying unit (or carrier amplifier), an auxiliary amplifying unit (or peaking amplifier) for optimal output capability and an individual matching network unit to each of the amplifiers, wherein the main amplifying unit and the auxiliary amplifying unit are connected through a microstrip transmission line with a length of $\lambda/4$ (hereinafter, referring to as '$\lambda/4$ line'). At this time, an offset line may be constructed by being installed between the two amplifiers and the $\lambda/4$ line for the correct operation of the Doherty amplifier.

The $\lambda/4$ line modulates the load impedance of the main amplifying unit according to an input drive level, and the offset line plays the roles of allowing the main amplifying unit to modulate the load impedance exactly in low input drive level and the auxiliary amplifying unit to prevent power leakage. In the result, the improved efficiency and linearity are obtained in comparison with a general balanced amplifier.

Meanwhile, when the Doherty amplifier is applied to a base station, the stringent linearity of a base station is satisfied by using feedforward or digital predistortion.

SUMMARY OF THE INVENTION

Technical Problem

The study for reducing the size of a circuit with regard to production cost as an important factor required in realization of the amplifier has been performed, and when this is applied to a portable terminal, the miniaturization is still required since the Doherty amplifier has to be realized on a thin module package. Further, likewise in case of the base station, the size reduction of the circuit is more important in reducing production cost.

Therefore, if the Doherty amplifier capable of maintaining linearity and high efficiency while realizing a small and simple circuit is realized, it is expected to be preferable that the aforementioned problems and need in the field of Doherty amplifier are solved.

It is, therefore, the present invention has been proposed in order to provide a Doherty amplifier capable of maintaining linearity and high efficiency with reducing the size of a circuit and simplifying the structure thereof.

Technical Solution

In accordance with an aspect of the present invention, there is provided a Doherty amplifier provided with a main amplifying unit and an auxiliary amplifying unit, comprising a first parallel capacitor grounded by being connected to a main amplifying unit in parallel; a second parallel capacitor grounded by being connected to an auxiliary amplifying unit in parallel; and a transmission line unit connecting the main amplifying unit and the auxiliary amplifying unit, and including any one of an inductor and a microstrip transmission line.

Herein, the Doherty amplifier further comprises a $\lambda/4$ line applying voltage to the main amplifying unit and the auxiliary amplifying unit by being divided between the first parallel capacitor and the transmission line unit.

Further, the Doherty amplifier includes a matching network unit divided between the second parallel capacitor and the transmission line unit.

And, the first parallel capacitor, the second parallel capacitor and the transmission line unit may have a n-network $\lambda/4$ line type.

In accordance with another aspect of the present invention, there is provided a Doherty amplifier provided with a main amplifying unit and an auxiliary amplifying unit, comprising a first parallel impedance grounded by being connected to the main amplifying unit in parallel; a second parallel impedance grounded by being connected to the auxiliary amplifying unit in parallel; a transmission line unit connecting the main amplifying unit and the auxiliary amplifying unit and including a capacitor; a first $\lambda/4$ line applying voltage to the main amplifying unit by being divided between the first parallel impedance and the transmission line unit; a second $\lambda/4$ line applying voltage to the auxiliary amplifying unit by being divided between the second parallel impedance and the transmission line unit; and a matching network unit divided among the auxiliary amplifying unit, the second parallel capacitor and the transmission line unit.

In accordance with another aspect of the present invention, there is provided a Doherty amplifier provided with a main amplifying unit and an auxiliary amplifying unit, comprising a first parallel impedance grounded by being connected to the main amplifying unit in parallel; a second parallel impedance grounded by being connected to the auxiliary amplifying unit in parallel; a first harmonics suppression unit grounded by being connected to the main amplifying unit and the first parallel impedance in parallel to suppress the harmonics; a second harmonics suppression unit grounded by being connected to the auxiliary amplifying unit and the second parallel impedance in parallel to suppress the harmonics; a first inductor applying voltage to the main amplifying unit and the auxiliary amplifying unit by being divided among the auxiliary amplifying unit, the second parallel impedance and the second harmonics suppression unit; a second inductor connecting the main amplifying unit and the auxiliary amplifying unit; and a matching network unit divided between the second parallel capacitor and the second inductor.

Further, in accordance with another aspect of the present invention, there is provided a Doherty amplifier provided with a main amplifying unit and an auxiliary amplifying unit, comprising a first matching network unit connected to the output stage of the main amplifying unit and matched so that the output of the main amplifying unit is an impedance of $100\Omega$; a second matching network unit connected to the output stage of the auxiliary amplifying unit and matched so that the output of the auxiliary amplifying unit is an impedance of $100\Omega$; a quarter-wave transmission line connected to the outputs of the first matching network unit and the second matching network unit with an impedance of $100\,\Omega$ generating final output by connecting the main amplifying unit and the auxiliary amplifying unit in parallel; a first offset line connected to the output stage of the first matching network unit with an impedance of 100 Ω; and a second offset line connected to the output stage of the second matching network unit with an impedance of 100 Ω.

Effect of the Invention

As described above, in accordance with the present invention, a Doherty amplifier capable of maintaining linearity and high efficiency with reducing the size of a circuit and simplifying the structure thereof is provided.

BRIEF DESCRIPTION OF THE DRAWINGS

FIG. 1 is a diagram showing an example of the construction of a conventional Doherty amplifier;

FIG. 2 is a diagram representing the construction of the Doherty amplifier in accordance with the first embodiment of the present invention;

FIG. 3 and FIG. 4 are diagrams illustrating examples of the constructions of n type λ/4 lines of the Doherty amplifier in FIG. 2.

FIG. 5 is a diagram illustrating the construction of the Doherty amplifier in accordance with the second embodiment of the present invention;

FIG. 6 is a diagram illustrating the construction of the Doherty amplifier in accordance with the third embodiment of the present invention; and FIG. 7 is a diagram illustrating the construction of the Doherty amplifier in accordance with the fourth embodiment of the present invention.

DETAILED DESCRIPTION OF THE INVENTION

Hereinafter, a preferred embodiment of the present invention will be described in detail with reference to the accompanying drawings. Herein, in explaining the present invention, the same component is represented by the same reference numeral and the description thereof will be omitted if necessary.

FIG. 2 is a diagram illustrating the construction of the Doherty amplifier in accordance with the first embodiment of the present invention. As shown in the drawing, the Doherty amplifier in accordance with the present invention includes a main amplifying unit 10, an auxiliary amplifying unit 20 and a compact λ/4 line 30.

The Doherty amplifier in accordance with the present invention improves entire efficiency of the Doherty amplifier by applying biases different from each other to the main amplifying unit 10 and the auxiliary amplifying unit 20 respectively or through an automatic bias control.

The compact λ/4 line 30 is connected to the output sides of the main amplifying unit 10 and the auxiliary amplifying unit 20 and connected to a λ/4 line 34 and a matching network unit 35. The compact λ/4 line 30 in accordance with the present invention, as shown in FIG. 2 to FIG. 4, may include a first parallel capacitor 31, a second parallel capacitor 32 and a pair of transmission line units 33a and 33b.

In FIG. 3, the compact λ/4 line 30 is realized into a n-network type through the inductor 33a, the first parallel capacitor 31 and the second parallel capacitor 32 and has a characteristic corresponding to the λ/4 transmission line. In FIG. 4, the compact λ/4 line 30 is constructed into a n-network type by replacing the inductor 33a in FIG. 3 with the microstrip transmission line 33b. Herein, in order to solve the problems that the capacity of the inductor is discontinuous and the loss of the inductor is great, the inductor 33a is replaced with the microstrip transmission, thereby realizing the n network type compact λ/4 line which has low loss, continuous value and considerable small size.

Herein, the first parallel capacitor 31 is grounded by being connected to the main amplifying unit 10 in parallel and the second parallel capacitor is grounded by being connected to the auxiliary amplifying unit 20 in parallel. The inductor 33a or the microstrip transmission line 33b connects the main amplifying unit 10 and the auxiliary amplifying unit 20.

Herein, the compact λ/4 line 30 with arbitrary characteristic impedance ($R_T$) is represented by the following [Equation 1] and [Equation 2] in combination with the characteristic impedance ($R_0$) of the microstrip transmission line 33b constituting the compact λ/4 line, a phase angle (θ), the first parallel capacitor 31 and the second parallel capacitor 32.

$$\theta = \arcsin\frac{R_T}{R_0} \quad \text{[Equation 1]}$$

$$C = \frac{\sqrt{R_0^2 - R_T^2}}{w_0 R_T R_0} \quad \text{[Equation 2]}$$

A circuit can be constructed by connecting the compact λ/4 line 30 shown in FIG. 4 to the right rear stages of the main amplifying unit 10 and the auxiliary amplifying unit 20 similar to the configuration of FIG. 2 by using the compact λ/4 line 30 directly or indirectly. Therefore, the size of a Doherty amplifier load network is reduced remarkably.

Meanwhile, the λ/4 line 34 is divided between the first parallel capacitor 31 and the pair of transmission line units 33a,33b and applies voltage to the main amplifying unit 10 and the auxiliary amplifying unit 20 at the same time. Further, the matching network unit 35 is divided between the second parallel capacitor 32 and the transmission line units 33a and 33b and the output from the matching network unit 35 is a final output of the Doherty amplifier in accordance with the first embodiment of the present invention.

FIG. 5 is a diagram illustrating the construction of the Doherty amplifier in accordance with the second embodiment of the present invention. The Doherty amplifier in accordance with the second embodiment of the present invention includes a main amplifying unit 10, an auxiliary amplifying unit 20, a first parallel impedance (jX') 231, a second parallel impedance (jX") 232, a combination unit of capacitor and transmission line 236, a first λ/4 line 233, a second λ/4 line 235 and a matching network unit 234.

The first parallel impedance (jX') 231 and the second parallel impedance (jX") 232 are grounded by being connected to the main amplifying unit 10 and the auxiliary amplifying unit 20 in parallel respectively. A combination unit of capacitor and transmission line 236 connects the main amplifying unit 10 and the auxiliary amplifying unit 20, wherein the combination unit of capacitor and transmission line 236 in accordance with the second embodiment of the present invention includes a capacitor as one example and may be constructed by combining a capacitor and a transmission line.

The first λ/4 line 233 is divided between the first parallel impedance (jX') 231 and the combination unit of capacitor and transmission line 236 and the second λ/4 line 235 is divided between the second parallel impedance (jX") 232 and the combination unit of capacitor and transmission line 236, respectively being used for a voltage input unit of the main amplifying unit 10 and the auxiliary amplifying unit 20. The matching network unit 234 is divided among the auxiliary amplifying unit 20, the second parallel impedance 232 and the combination unit of capacitor and transmission line 236.

The Doherty amplifier in accordance with the second embodiment of the present invention has a structure generalizing the construction of the compact λ/4 line 30 by replacing the microstrip transmission line 33a of the compact λ/4 line 30 of the Doherty amplifier in accordance with the first embodiment of the present invention with a capacitor or the combination of a capacitor and a transmission line.

Through the above-described construction, the Doherty amplifier in accordance with the second embodiment of the present invention becomes to have a simple structure and a small circuit compared with the conventional Doherty amplifier shown in FIG. 1, thereby reducing the entire production cost.

FIG. 6 is a diagram illustrating the construction of the Doherty amplifier in accordance with the third embodiment of the present application. The Doherty amplifier in accordance with the third embodiment of the present application includes a main amplifying unit 10, an auxiliary amplifying unit 20, a first parallel impedance (jX') 331, a second parallel impedance (jX") 332, a first harmonics suppression unit 333a, a second harmonics suppression unit 333b, a first inductor 335, a second inductor 336 and a matching network unit 334.

The first parallel impedance (jX') 331 and the second parallel impedance (jX") 332 are grounded by being connected to the main amplifying unit and the auxiliary amplifying unit in parallel respectively and the second inductor 336 connects the main amplifying unit 10 and the auxiliary amplifying unit 20. The first inductor 335 is used for a voltage input unit of the main amplifying unit 10 and the auxiliary amplifying unit 20, the matching network unit 334 is divided between the first inductor 335 and the second inductor 336 and among the second parallel impedance (jX"), the second harmonics suppression unit 333b and the auxiliary amplifying unit 20.

The first harmonics suppression unit 333a is grounded by being connected to the main amplifying unit 10 and the first parallel impedance (jX') 331 in parallel, thereby improving the performance of the circuit by suppressing the harmonics occurring in the main amplifying unit 10. The second harmonics suppression unit 333b is grounded by being connected to the auxiliary amplifying unit 20 and the second parallel impedance (jX") 332 in parallel, thereby improving the performance of the circuit by suppressing the harmonics occurring in the auxiliary amplifying unit 20.

Through the above-described construction, the Doherty amplifier in accordance with the third embodiment of the present invention is realized by replacing the microstrip transmission line 33a of the compact λ/4 line 30 of the Doherty amplifier in accordance with the first embodiment of the invention with the second inductor 336 and further includes the first harmonics suppression unit 333a and the second harmonics suppression unit 333b to suppress harmonics and the first inductor 335 used as the voltage input unit so as to be suitable for the integrated circuit, wherein the first inductor 335 and the second inductor 336 may include the combination of all constructions including inductance.

Hereafter, referring to FIG. 7, the Doherty amplifier is described in accordance with the fourth embodiment of the present invention in detail.

The Doherty amplifier in accordance with the fourth embodiment of the present invention includes a first matching network unit 110a, a second matching network unit 110b, a quarter-wave transmission line 130, a first offset line 120a and a second offset line 120b.

The first matching network unit 110a is connected to the output stage of the main amplifying unit 10 and matched so that the output of the main amplifying unit 10 is an impedance of 100Ω and the second matching network unit 110b is connected to the output stage of the auxiliary amplifying unit 20 and matched so that the output of the auxiliary amplifying unit 20 is an impedance of 100 Ω.

The quarter-wave transmission line 130 connects the main amplifying unit 10 and the auxiliary amplifying unit 20 in parallel by being connected to the outputs of the first matching network unit 110a and the second matching network unit 110b. Herein, the final output of the Doherty amplifier in accordance with the fourth embodiment of the present invention corresponds to the output from the quarter-wave transmission line 130.

The first offset line 120a is connected to the output stage of the first matching network unit 11a and has an impedance of 100 Ω. Further, the second offset line 120b is connected to the output stage of the second matching network unit 110b and has an impedance of 100Ω.

Herein, the final output impedances of the first offset line 120a and the quarter-wave transmission line 130 are 100 Ω. The main amplifying unit 10 and the auxiliary amplifying unit 20 matched to 110 Ω are combined, thereby realizing 50 Ω of output load resistance.

Through such a construction, the Doherty amplifier in accordance with the fourth embodiment of the present invention is capable of removing the last matching network unit in the conventional Doherty amplifier shown in FIG. 1, thereby realizing the Doherty amplifier with further simple structure.

While the present invention has been described with respect to certain preferred embodiments, it will be apparent to those skilled in the art that various changes and modifications may be made without departing from the scope of the invention as defined in the following claims.

What is claimed is:

1. A Doherty amplifier provided with a main amplifying unit and an auxiliary amplifying unit, comprising:
   a first parallel capacitor grounded by being connected to the main amplifying unit in parallel;
   a second parallel capacitor grounded by being connected to the auxiliary amplifying unit in parallel;
   a transmission line unit connecting the main amplifying unit and the auxiliary amplifying unit and including one of an inductor and a microstrip transmission line; and
   a λ/4 line applying voltage to the main amplifying unit and the auxiliary amplifying unit by being divided between the first parallel capacitor and the transmission line unit.

2. The Doherty amplifier as recited in claim 1, further comprising a matching network unit divided between the second parallel capacitor and the transmission line unit.

3. The Doherty amplifier as recited in claim 1, wherein the first parallel capacitor, the second parallel capacitor and the transmission line unit form a π-network type compact λ/4 line.

4. The Doherty amplifier as recited in claim 2, wherein the first parallel capacitor, the second parallel capacitor and the transmission line unit form a π-network type compact λ/4 line.

5. A Doherty amplifier provided with a main amplifying unit and an auxiliary amplifying unit, comprising:
   a first parallel impedance grounded by being connected to the main amplifying unit in parallel;
   a second parallel impedance grounded by being connected to the auxiliary amplifying unit in parallel;

a transmission line unit connecting the main amplifying unit and the auxiliary amplifying unit and constructed by including a capacitor;

a first λ/4 line applying voltage to the main amplifying unit by being divided between the first parallel impedance and the transmission line unit;

a second λ/4 line applying voltage to the auxiliary amplifying unit by being divided between the second parallel impedance and the transmission line unit; and a matching network unit divided among the auxiliary amplifying unit, the second parallel impedance and the transmission line unit.

6. A Doherty amplifier provided with a main amplifying unit and an auxiliary amplifying unit, comprising:

a first parallel impedance grounded by being connected to the main amplifying unit in parallel;

a second parallel impedance grounded by being connected to the auxiliary amplifying unit in parallel;

a first harmonics suppression unit grounded by being connected to the main amplifying unit and the first parallel impedance in parallel to suppress the harmonics;

a second harmonics suppression unit grounded by being connected to the auxiliary amplifying unit and the second parallel impedance in parallel to suppress the harmonics;

a first inductor applying voltage to the main amplifying unit and the auxiliary amplifying unit by being divided among the auxiliary amplifying unit, the second parallel impedance and the second harmonics suppression unit;

a second inductor connecting the main amplifying unit and the auxiliary amplifying unit; and a matching network unit divided between the second parallel capacitor and the second inductor.

7. A Doherty amplifier provided with a main amplifying unit and an auxiliary amplifying unit, comprising:

a first matching network unit connected to the output stage of the main amplifying unit and matched so that the output of the main amplifying unit is an impedance of 100 Ω;

a second matching network unit connected to the output stage of the auxiliary amplifying unit and matched so that the output of the auxiliary amplifying unit is an impedance of 100 Ω;

a quarter-wave transmission line connected to the outputs of the first matching network unit and the second matching network unit with an impedance of 100 Ω generating final output by connecting the main amplifying unit and the auxiliary amplifying unit in parallel;

a first offset line connected to the output stage of the first matching network unit with an impedance of 100Ω; and a second offset line connected to the output stage of the second matching network unit with an impedance of 100 Ω.

* * * * *